United States Patent
Campbell et al.

[19]

[11] Patent Number: 6,018,402
[45] Date of Patent: Jan. 25, 2000

[54] APPARATUS AND METHOD FOR PHASE-ENCODING OFF-AXIS SPATIAL LIGHT MODULATORS WITHIN HOLOGRAPHIC DATA SYSTEMS

[75] Inventors: Scott Patrick Campbell, Chatham; Kevin Richard Curtis, Summit, both of N.J.

[73] Assignee: Lucent Technologies Inc., Murray Hill, N.J.

[21] Appl. No.: 09/047,050

[22] Filed: Mar. 24, 1998

[51] Int. Cl.[7] .................................................. G03H 1/26
[52] U.S. Cl. .............................. 359/22; 359/11; 359/30; 359/15; 365/124; 365/125; 365/216
[58] Field of Search .................................. 359/11, 12, 21, 359/22, 30, 31, 35, 15; 365/124, 125, 216

[56] References Cited

U.S. PATENT DOCUMENTS

| | | | |
|---|---|---|---|
| 5,450,218 | 9/1995 | Heanue et al. | 359/21 |
| 5,508,841 | 4/1996 | Lin et al. | 359/318 |
| 5,621,549 | 4/1997 | Redfield | 359/24 |
| 5,627,664 | 5/1997 | Trisnadi | 359/11 |

*Primary Examiner*—Cassandra Spyrou
*Assistant Examiner*—Craig Curtis
*Attorney, Agent, or Firm*—John M. Harman

[57] ABSTRACT

Embodiments of the invention include an off-axis amplitude and phase encoding optical system, apparatus and method of storage in which a holographic optical element (HOE) is used advantageously to reconstruct optical elements typically used to phaseencode an object beam emanating from a spatial light modulator (SLM). The optical system includes a spatial light modulator (SLM) such as a digital micromirror device (DMD), a data storage device such as a holographic memory cell (HMC), and the holographic optical element (HOE) for duplicating the phase-encoding functions typically performed on an object beam emanating from the SLM prior to alignment with the holographic memory cell (HMC). Conventionally, a phase mask along with one or more optical elements comprising a four-F lens system typically are needed to phase encode the amplitude-encoded light pattern that propagates from the SLM. According to embodiments of the invention, a holographic optical element (HOE) replaces the phase mask and other optical elements and performs the necessary phase encoding on the amplitude-encoded beam prior to the beam being aligned with the holographic memory cell (HMC) for storage therein. Once generated, the holographic optical element (HOE) replaces the complicated phase mask and conventional four-F lens system arrangement typically used to phase-encode an amplitude-encoded object beam emanating from the spatial light modulator (SLM) of the off-axis amplitude and phase encoding optical system.

25 Claims, 2 Drawing Sheets

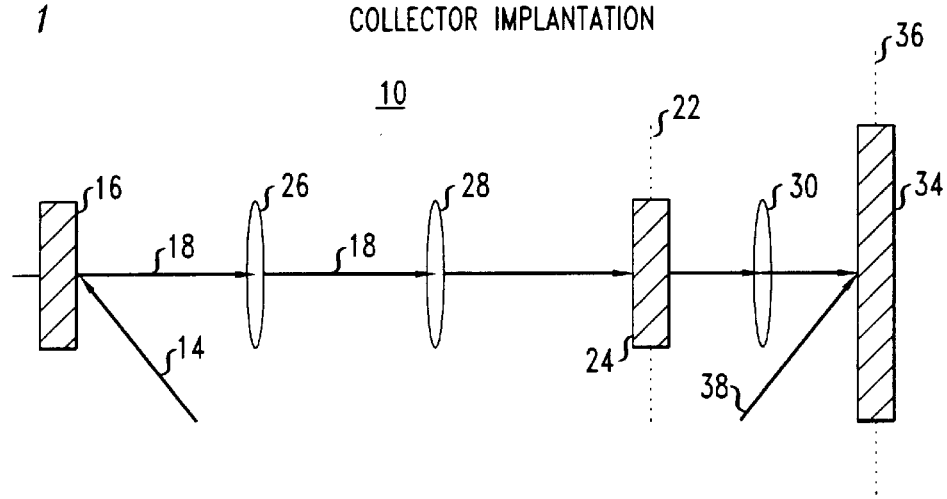
FIG. 1 COLLECTOR IMPLANTATION
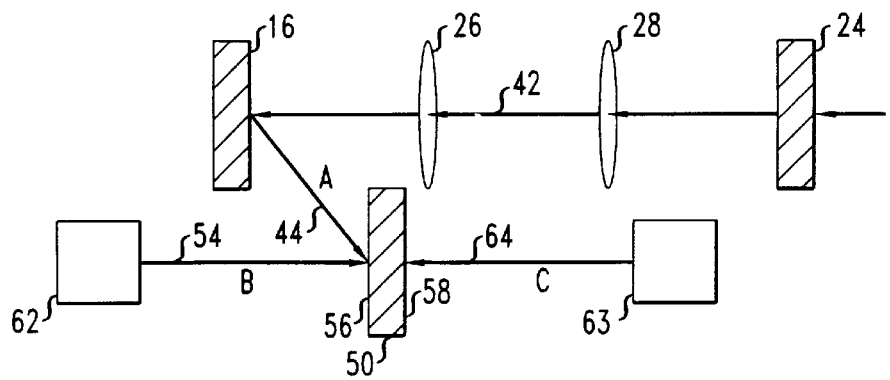
FIG. 2
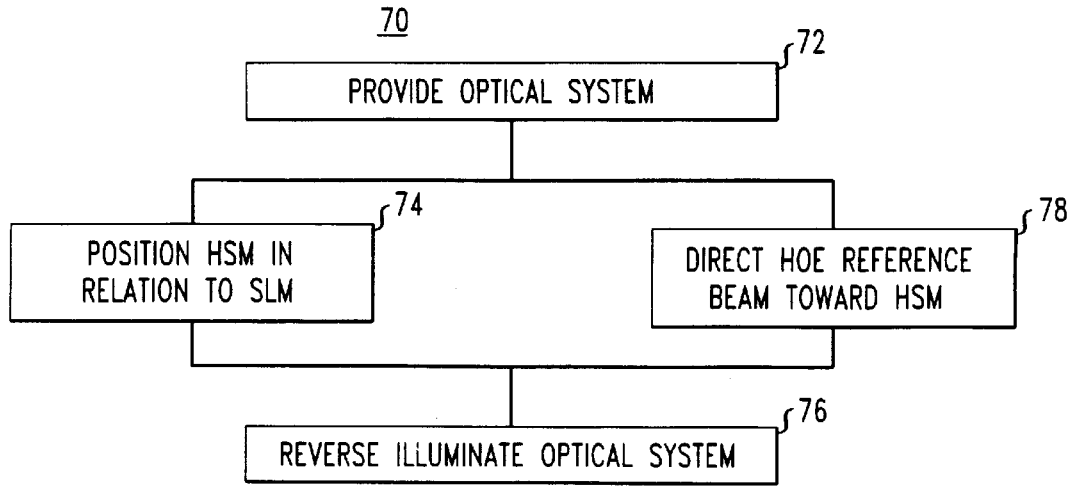
FIG. 3

APPARATUS AND METHOD FOR PHASE-ENCODING OFF-AXIS SPATIAL LIGHT MODULATORS WITHIN HOLOGRAPHIC DATA SYSTEMS

BACKGROUND OF THE INVENTION

1. Field of the Invention

The invention relates to holographic storage. More particularly, the invention relates to an apparatus and method for producing encoded optical beams within holographic memory systems.

2. Description of the Related Art

Holographic memory systems involve the three-dimensional storage of holographic representations (i.e., holograms) of data elements as a pattern of varying refractive index and/or absorption imprinted in the volume of a storage medium such as a crystal of lithium niobate. Holographic memory systems are characterized by their high density storage potential and the potential speed with which the stored data is randomly accessed and transferred.

In general, holographic storage memory systems operate by combining a data-encoded object beam with a reference beam to create an interference pattern throughout a photosensitive storage medium such as a holographic memory cell (HMC). The interference pattern induces material alterations in the storage medium that generate a hologram.

The object beam typically is formed by transmitting laser light through a spatial light modulator (SLM), e.g., a liquid crystal display (LCD) screen or a digital micro-mirror device (DMD). The SLM typically contains a pattern of clear and opaque (pixel) regions corresponding to a two-dimensional depiction of the digital data to be stored. The laser light signal emanating from the SLM is then relayed, e.g., by lenses, to create the object beam.

The formation of the hologram in the holographic memory cell (HMC) or other suitable storage medium is a function of the relative amplitudes and polarization states of, and phase differences between, the object beam and the reference beam. It is also highly dependent on the wavelengths and angles at which the object beam and the reference beam are projected into the storage medium. In this manner, it is possible to encode data, e.g., by phase, angle or wavelength, prior to storage of the encoded data within the storage medium.

It is possible to further encode the object beam generated by the SLM by using, e.g., phase plates or lenses. These additional encoding techniques work to improve object beam intensity uniformity at the recording media, which typically results in improved system signal-to-noise ratio and storage density.

Holographically-stored data is reconstructed by projecting a reference beam similar to the reference beam used in storing the data into the HMC at the same angle, wavelength, phase and position used to produce the hologram. The hologram and the reference beam interact to reconstruct the stored object beam. The reconstructed object beam then is detected, e.g., using a photodetector array. Once detected, the recovered data is, e.g., post processed for delivery to output devices.

During phase-encoding, the data emanating from the spatial light modulator (SLM) is directed through a phase mask (such as lenses, lens arrays or random phase masks) prior to storage within a storage medium. When the spatial light modulator (SLM) is illuminated on-axis (i.e., when the illumination beam is perpendicular to the plane of the SLM), the phase mask typically is placed in contact with the SLM. However, when the spatial light modulator (SLM) is operating in an off-axis mode, the phase mask typically is placed in the image plane of the SLM following the SLM to ensure proper operation of the phase mask. However, such an arrangement typically requires additional optics between the SLM and the phase mask.

Therefore, it is desirable to provide a relatively inexpensive, simple and reproducibly consistent replacement for one or more of the elements that typically are required of phase encoding optical systems with off-axis spatial slight modulators (SLMs).

SUMMARY OF THE INVENTION

The invention is embodied in an off-axis amplitude and phase encoding optical system, apparatus and method of storage in which a holographic optical element (HOE) is used advantageously to reconstruct optical elements typically used to phase-encode an object beam emanating from a spatial light modulator (SLM). The optical system includes a spatial light modulator (SLM) such as a digital micro-mirror device (DMD), a data storage device such as a holographic memory cell (HMC), and the holographic optical element (HOE) for duplicating the phase-encoding functions typically performed on an object beam emanating from the SLM prior to alignment with the holographic memory cell (HMC). The SLM induces amplitude modulation on an off-axis illumination beam illuminating the SLM. Conventionally, a phase mask along with one or more optical elements comprising a four-F lens system typically are needed to phase encode (at the SLM image plane) the amplitude-encoded light pattern that propagates from the SLM. According to embodiments of the invention, a holographic optical element (HOE) replaces the phase mask and other optical elements and performs the necessary phase encoding on the amplitude-encoded beam prior to the beam being aligned with the holographic memory cell (HMC) for storage therein.

The holographic optical element (HOE) is formed within a holographic storage material such as a photopolymer, a photoresist, a thermoplastic material, a photochemical material, a photorefractive material or a photochromatic material. The holographic optical element (HOE) is generated or formed by interfering a reverse-illuminated amplitude- and phase-encoded object beam with an HOE reference beam in such a way that the pattern is storable within the holographic storage material. The direction of the HOE reference beam determines whether the holographic optical element (HOE), during subsequent use, produce a transmission hologram or a reflection hologram. Once generated, the holographic optical element (HOE) replaces the complicated phase mask and conventional four-F lens system arrangement typically used to phase-encode an amplitude-encoded object beam emanating from the spatial light modulator (SLM) of the off-axis amplitude and phase encoding optical system. In this manner, system efficiency is improved through the direct performance of phase-encoding, a reduction in the overall optical path length resulting from a reduction in the number of elements in the optical path, the associated cost reduction and the reduced power requirements of the system.

BRIEF DESCRIPTION OF THE DRAWINGS

In the drawings:

FIG. 1 is a simplified schematic diagram of a portion of a conventional off-axis amplitude and phase encoding optical system;

FIG. 2 is a simplified schematic diagram of the generation or formation of a holographic optical element according to an embodiment of the invention;

FIG. 3 is a simplified block diagram of a method for making a holographic optical element according to an embodiment of the invention;

DETAILED DESCRIPTION

Figure 4:
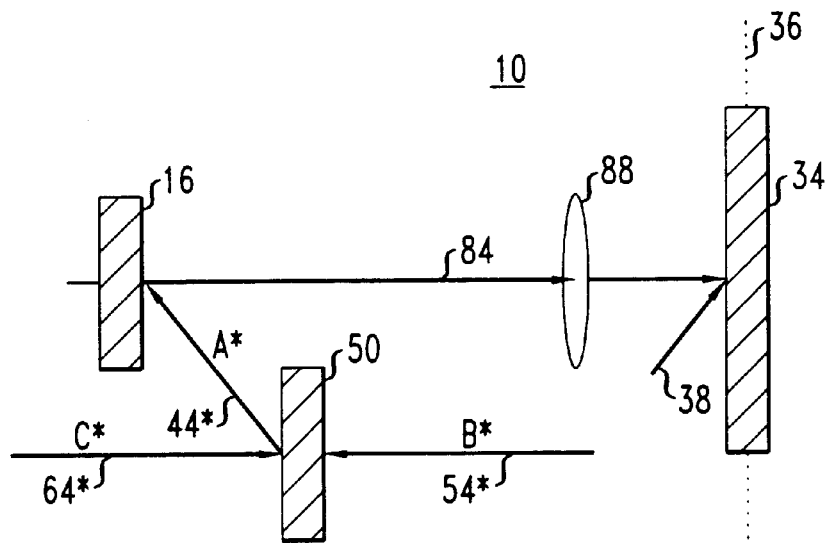
FIG. 4 is a simplified schematic diagram of the use of a holographic optical element according to an embodiment of the invention.

In the following description similar components are referred to by the same reference numeral in order to simplify the sequential aspect of the drawings and to enhance the understanding of the invention through the description of the drawings.

Although specific features, configurations and arrangements are discussed hereinbelow, it should be understood that such is done for illustrative purposes only. A person skilled in the relevant art will recognize that other steps, configurations and arrangements can be used without departing from the spirit and scope of the invention.

Referring now to FIG. 1, a conventional off-axis amplitude and phase encoding optical system 10 is shown. In this arrangement, an off-axis illuminating beam 14 (e.g., a plane wave, coherent beam of laser light) illuminates a spatial light modulator (SLM) 16, as shown. SLM 16 is a digital micromirror device (DMD) or other suitable device capable of operating in an off-axis mode. SLM 16 behaves as an amplitude mask and thereby induces amplitude modulation on the illuminating beam 14, which encodes the resulting beam with the data to be stored. The result is an amplitude-encoded optical pattern 18 emanating from SLM 16.

When operating SLM 16 in an off-axis mode, i.e., when the illumination beam is at least approximately 5 degrees off of perpendicular to the plane of the pixel array in the SLM, phase randomization generally must be performed in an image plane (shown as 22) following SLM 16. Image plane 22 is the plane where optical pattern 18 forms an image of the input SLM 16.

Phase randomization allows for better distribution of optical energy from SLM 16 in the Fourier plane of SLM 16. As will be evident from discussions hereinbelow, the improved energy distribution from phase randomization aids in optimizing the volume elements such as holographic storage media (discussed below) during holographic storage and recall and the optical modulation depths of the hologram during storage.

To accomplish proper phase randomization for SLMs operating in the off-axis mode, a phase mask 24 is positioned in image plane 22 of optical pattern 18. Typically, the mask must be within approximately $\Delta^2 n/\lambda$ of the image plane, where $\Delta$ is the pixel size of the mask pixels, $\lambda$ is the wavelength of the beam, and n is the index of refraction associated with the mask.

However, such an arrangement requires additional optics, e.g., the four-F lens system (i.e., lenses 26, 28), to be positioned between SLM 16 and phase mask 24. In this manner, as optical pattern 18 illuminates phase mask 24 and propagates therethrough, optical pattern 18 also becomes phase-encoded. Thus, as optical pattern 18 emanates from phase mask 24, it is both amplitude-encoded and phase-encoded.

Optical system 10 includes a holographic storage medium (HSM) 34 such as a holographic memory cell (HMC) for holographic storage of the data conveyed by optical pattern 18 and a lens 30 positioned as shown between phase mask 24 and holographic storage medium 34, which is positioned in the Fourier plane (shown generally as 36) of optical pattern 18. Optical pattern 18 is an object beam for purposes of holographic data storage and thus, for purposes of discussion herein, is referred to, e.g., as an HSM object beam or an HMC object beam.

A reference beam 38 (referred to, e.g., as an HSM or HMC reference beam) is directed appropriately to illuminate holographic storage medium 34 and intersect with optical pattern 18 at a desired location within holographic storage medium 34. The resulting interference pattern between optical pattern 18 (i.e., the object beam) and reference beam 38 is captured as a hologram within holographic storage medium 34.

The arrangement of optical system 10, however, has problems associated therewith. For example, phase masks 24 generally are delicate in structure, and lenses 26 generally are expensive and bulky. Furthermore, the alignment of these elements is critical down to the micron ($\mu$m) level and thus needs to be consistent from system to system. The level of such consistency often is difficult if not impossible to achieve using the conventional arrangement of optical system 10 shown in FIG. 1.

According to embodiments of the invention, a holographic optical element (HOE) is generated to replace phase mask 24 and the four-F lens system shown in FIG. 1. The holographic optical element (HOE) is formed from a holographic storage material, which is any suitable material or configuration or arrangement of materials that is capable of recording either surface or volume holograms or creating diffracted optics. For example, the holographic storage material is a photopolymer, a photoresist, a thermoplastic material, a photochemical material, a photorefractive material or a photochromatic material.

Referring now to FIG. 2, the generation or formation of a holographic optical element (HOE) according to an embodiment of the invention is shown. An optical path arrangement similar to that shown in FIG. 1 is used for initial generation of the holographic optical element (HOE). Once formed, the holographic optical element (HOE) is used in subsequent applications as a replacement for the phase mask and four-F lens arrangement used in the conventional optical system of FIG. 1.

Referring again to FIG. 2, the optical path arrangement shown is reverse illuminated by a reverse illuminating beam 42, which is a coherent beam of light. Reverse illuminating beam 42 is directed through phase mask 24 and lenses 28 and 26 to SLM 16. All pixels in SLM 16 are set "on" during this HOE formation stage. Alternatively, as will be discussed in greater detail hereinbelow, the activation of various pixels of SLM 16 during back illumination with different phase masks provides correspondingly different phase structures for holograms being stored in the holographic optical element (HOE). In this manner, the differing phase structure provides an extra degree of delineation between stored optical patterns.

The light beam 44 emanating from SLM 16 as a result of the reverse illumination by reverse illuminating beam 42 is labeled as beam A. For purposes of discussion herein, beam A is referred to as the HOE object beam, i.e., the object beam used to generate or form the holographic optical element (HOE). According to embodiments of the invention, HOE object beam 44 (beam A) propagates or is otherwise directed toward a holographic storage material 50, within which a holographic optical element (HOE) is formed, as will become apparent from further discussion hereinbelow.

HOE object beam 44 passes through holographic storage material 50, where it intersects a second beam (shown as 54 and labeled B), which is the reference beam for purposes of generating the holographic optical element (HOE). Holographic storage material 50, e.g., has a first surface (shown generally as 56) and an opposing second surface (shown generally as 58) and has an overall quality that is sufficiently planar or reproducible to better than ten (10) wavelengths of light per centimeter (cm).

HOE reference beam 54, which is coherent with HOE object beam 44, is generated from a source 62 and is directed appropriately toward first surface 56 of holographic storage material 50 to intersect with HOE object beam 54 at a desired location within holographic storage material 50. The resulting interference pattern between HOE object beam 44 and HOE reference beam 54 is captured as a transmission hologram within holographic storage material 50, thus transforming holographic storage material 50 into a transmission-mode holographic optical element (HOE).

Alternatively, a second HOE reference beam (shown as 64 and labeled C), which is generated from a source 63, is directed appropriately toward second surface 58 of holographic storage material 50 to intersect with HOE object beam 44 at a desired location within holographic storage material 50. The resulting interference pattern between HOE object beam 44 and alternative HOE reference beam 64, which is coherent with beam 44, is captured as a reflection hologram within holographic storage material 50, thus transforming holographic storage material 50 into a reflection-mode holographic optical element (HOE).

Reverse illuminating beam 42, HOE object beam 44, HOE reference beam 54 and HOE reference beam 64 are any suitable beams, but typically are plane waves or other beams that are easily reproducible. Reverse illuminating beam 42, transmission HOE reference beam 54 and reflection HOE reference beam 64 typically are generated by coherent light from the same or similar laser source, as is known to anyone skilled in the art of holography. It should be noted that although both HOE reference beams 54 and 64 are coherent with HOE object beam 44, HOE reference beams 54 and 64 are unrelated. That is, beams 54 and 64 do not necessarily counter-propagate one another. Also, only one of HOE reference beams 54 and 64 is used at a given time to interfere with HOE object beam 44 to generate the holographic optical element (HOE).

As discussed previously herein, the activation of various pixels of SLM 16 during back illumination and different phase masks provides correspondingly different amplitude and phase structures for the holograms being stored. For example, with all SLM pixels set "on", the optical path arrangement in FIG. 2 using a first phase mask ($\phi_1$) and a first reference beam (REF$_1$) stores a hologram having a first structure, while a second phase mask ($\phi_2$) and a second reference beam (REF$_2$) stores a hologram having a second structure that differs from the first structure. The difference between the phase mask structures provides an extra degree of differentiation between holograms being stored in the holographic optical element (HOE).

Alternatively, varying SLM pixel settings, i.e., varying the activation states (continuously between "off" and "on") of pixels individually throughout the SLM likewise will produce correspondingly different amplitude and phase structures for the holograms being stored. That is, with a first SLM pixel setting, the optical path arrangement in FIG. 2 using a first phase mask ($\phi_1$) and a reference beam stores a hologram having a first structure, while a second SLM pixel setting (which may or may not be orthogonal to the first SLM pixel setting) and a second phase mask ($\phi_2$) stores a hologram having a second structure different from the first structure. Again, as discussed previously herein, the difference between the phase mask structures provides an extra between holograms being stored in the holographic optical element (HOE). Similarly, the differences between the amplitude (SLM) structures provide additional degrees of freedom between holograms being stored in the HOE.

Referring now to FIG. 3, a method 70 for generating or forming a holographic optical element according to embodiments of the invention is shown. Method 70 includes a first step 72 of providing an optical system, e.g., the optical system shown in FIG. 2.

The next step 74 is to position holographic storage material 50 appropriately with respect to SLM 16 in such a way that light emanating from SLM 16 (e.g., HOE object beam 44) is directed sufficiently and appropriately toward holographic storage material 50 for proper holographic storage of the information conveyed by beam 44. For example, the distance between SLM 16 and the holographic optical element (HOE) and the angle of HOE object beam 44 relative to SLM 16 must be kept the same (within reasonable tolerances) as they were during the formation of the holographic optical element (HOE).

A next step 76 is to reverse illuminate the optical system by directing reverse illuminating beam 42 through phase mask 24 and lenses 26 to SLM 16. Step 76 is performed, e.g., in a conventional manner.

A next step 78, which is to be performed, e.g., simultaneously with positioning step 74, is to direct HOE reference beam 54 (or beam 64) toward the holographic storage material to interfere with HOE object beam 44 at the desired location within holographic storage material 50. As discussed previously herein, the interference pattern is captured at the desired location within the holographic storage material, thus transforming holographic storage material 50 into a holographic optical element (HOE).

Both transmission-mode and reflection-mode holographic optical elements (HOE) are capable of storing multiple HOE object beams therein via conventional multiplexing techniques, such as angle multiplexing, wavelength multiplexing, phase multiplexing, spatial multiplexing, shift multiplexing, correlation multiplexing and peristropic multiplexing. For example, if the holographic optical element (HOE) is relatively thick, e.g., 1 millimeter (mm), multiple HOE object beams are multiplexed in the holographic optical element (HOE), e.g., by changing the angle, wavelength or position of the HOE reference beam while changing the HOE object beam characteristics. HOE object beam changes include, e.g., the use of a different mask, filter or lens combination.

Referring now to FIG. 4, the holographic optical element (HOE) generated in FIG. 2 is shown in use. As discussed previously herein, the holographic optical element (HOE) is formed within holographic storage material 50. Initially, holographic storage material 50 is positioned appropriately with respect to SLM 16. The phase conjugate of HOE reference beam 54 (shown as beam 54*) or beam 64 (beam 64*) is directed toward the appropriate surface of holographic storage material 50, as shown. The interaction of beam 54* or beam 64* with the holographic optical element (HOE) reconstructs the phase conjugate of beam 44, which is shown generally as beam 44\*. Beam 44\* is used to illuminate SLM 16 in a conventional manner.

The optical pattern 84 emanating from SLM 16 upon illumination thereof is an axially-matched, phase-encoded optical pattern to be used as an object beam for purposes of holographic data storage. That is, according to embodiments of the invention, optical pattern 84 is a reconstruction of the optical pattern 18 emanating from phase mask 24 and subsequently captured on holographic storage medium 34 in the conventional arrangement shown in FIG. 1. In this manner, the holographic optical element (HOE) generated within holographic storage material 50 and used according to embodiments of the invention advantageously eliminates the need for the relatively complex phase-encoding arrangement (phase mask and four-F lens system) employed by conventional optical systems, e.g., as shown in FIG. 1.

A holographic storage medium 34 such as a holographic memory cell (HMC) for holographic storage of the data conveyed by optical pattern 84 is positioned relative to the plane of interest, e.g., the Fourier plane of optical pattern 84 in this arrangement. With optical pattern 84 functioning as an object beam for purposes of holographic data storage, a reference beam (e.g., HMC reference beam 38 or similar reference beam) is directed appropriately through a lens 88 (similar to lens 30 in FIG. 1) to illuminate holographic storage medium 34 and intersect with optical pattern 84 at a desired location within holographic storage medium 34. The resulting interference pattern between optical pattern 84 (i.e., the HMC object beam) and reference beam 86 (i.e., the HMC reference beam) is captured as a hologram within holographic storage medium 34.

Figure 5:
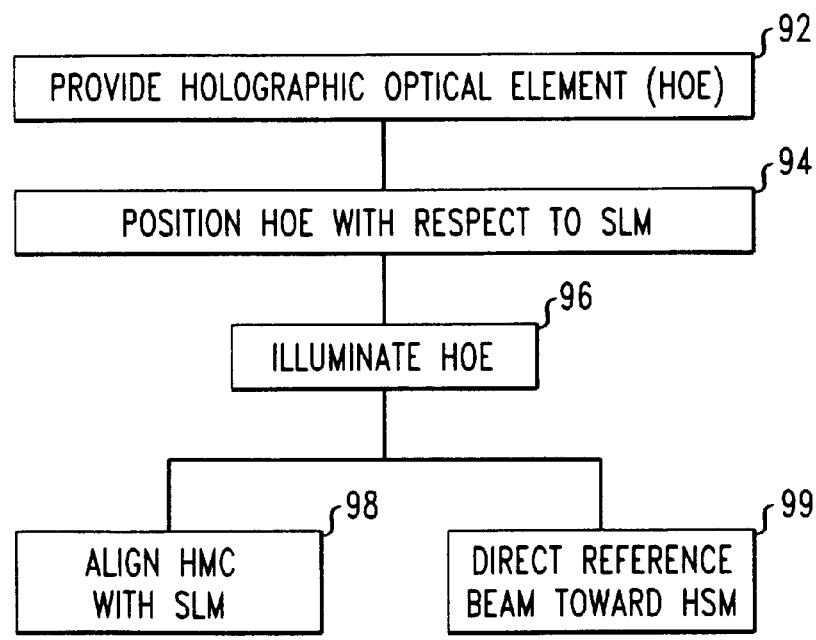
FIG. 5 is a simplified block diagram of a method for using a holographic optical element according to an embodiment of the invention.

FIG. 5 illustrates a method 90 for using a holographic optical element (HOE) according to embodiments of the invention (e.g., as shown in FIG. 4). Method 90 includes a first step 92 of providing a holographic optical element (HOE) having holographic representations of an encoded optical pattern or data beam (e.g., the HOE object beam). A second step 94 is to position the HOE appropriately with respect to a spatial light modulator (SLM), e.g., SLM 16 shown in FIG. 4. As discussed previously herein, the distance between SLM 16 and the holographic optical element (HOE) and the angle of HOE object beam 44 relative to SLM 16 must be kept the same (within reasonable tolerances) as they were during the formation of the holographic optical element (HOE).

The next step 96 is to illuminate the HOE by directing a beam (e.g., the HOE reference beam) toward the HOE; As discussed previously herein in describing FIG. 4, illumination of the HOE with an appropriate HOE reference beam (e.g., beam 54\* or beam 64\*) reconstructs the phase conjugate of beam A (i.e., beam 44\*). According to embodiments of the invention, beam. 44\* illuminates SLM 16 in a manner that reconstructs the amplitude-encode, phase-encoded optical pattern (shown as 84 in FIG. 4) containing the information desired for holographic storage.

The next step 98 of method 90 is to align and/or position a holographic storage medium 34 such as a holographic memory cell (HMC) with respect to SLM 16 and the optical pattern emanating therefrom. Simultaneously, a step 99 of directing a reference beam (e.g., HMC reference beam 86) appropriately toward holographic storage material 50 is performed. Step 99 forms an interference pattern between HMC reference beam 86 and the optical pattern (i.e., HMC object beam 84) at a desired location within holographic storage medium 34 that, in a conventional manner, is captured as a hologram within holographic storage medium 34.

It should be understood, e.g., from the previous discussions herein, that holographic optical elements (HOEs) lend themselves well to duplication on a mass production scale. For example, once an initial, master holographic optical element (HOE) is generated, it is possible for duplicates thereof to be generated using conventional techniques such as stamping and embossing. Also, it should be understood that volume reproduction of holographic optical elements (HOE) is possible. That is, an initially-generated holographic optical element (HOE) is used to generate a second, identical holographic optical element (HOE). More specifically, the data from an initial-generated holographic optical element (HOE) is read out and used to generate a second holographic optical element (HOE). In this manner, serial reproduction of holographic optical elements (HOE) containing the same information is possible.

It will be apparent to those skilled in the art that many changes and substitutions can be made to the embodiments of the optical systems, devices and methods herein described without departing from the spirit and scope of the invention as defined by the appended claims and their full scope of equivalents.

What is claimed is:

1. A holographic memory system, said system comprising:

at least one spatial light modulator (SLM) capable of operating in an off-axis mode;

a holographic optical element (HOE) having stored therein at least one hologram having at least the phase-encoding functions of at least one phase mask and the focusing functions of at least one lens arrangement;

at least one source for generating an HOE reference beam and a holographic memory cell (HMC) reference beam; and at least one data storage device, wherein said holographic optical element (HOE), upon illumination by said HOE reference beam, reconstructs a phase-encoded HOE object beam for illumination of said SLM, said SLM capable of inducing amplitude modulation on said phase-encoded HOE object beam, wherein said SLM, upon illumination by said phase-encoded HOE object beam, projects an amplitude-encoded and phase-encoded HMC object beam that, upon interfering with said HMC reference beam at a location within said data storage device, stores at least one hologram of said HMC object beam within said data storage device.

2. The system as recited in claim 1, wherein said holographic optical element (HOE) has a first surface and an opposing second surface, wherein said HOE reference beam illuminates said holographic optical element (HOE) from said first surface and wherein said holographic optical element (HOE) projects a transmission HOE object beam from said first surface thereof.

3. The system as recited in claim 1, wherein said holographic optical element (HOE) has a first surface and an opposing second surface, wherein said HOE reference beam illuminates said holographic optical element (HOE) from said second surface and wherein said holographic optical element (HOE) projects a reflection HOE object beam from said first surface thereof.

4. The system as recited in claim 1, wherein said holographic optical element (HOE) is made of at least one material selected from the group consisting of a photopolymer, a photoresist, a thermoplastic material, a photochemical material, a photorefractive material or a photochromatic material.

5. The system as recited in claim 1, wherein said holographic optical element (HOE) has stored therein a plurality of holograms, wherein said plurality of holograms are multiplexed using at least one multiplexing technique selected from the group consisting of angle multiplexing, wavelength multiplexing, phase multiplexing, spatial multiplexing, shift multiplexing, correlation multiplexing and peristropic multiplexing.

6. The system as recited in claim 1, wherein at least one of said generating sources is a laser.

7. The system as recited in claim 1, wherein said data storage device is a holographic memory cell (HMC).

8. An apparatus for use in a holographic memory system, said apparatus comprising:

a holographic optical element (HOE) having stored therein at least one hologram having at least the phase-encoding functions of at least one phase mask and the focusing functions of at least one lens arrangement, and whereupon illumination of said holographic optical element by an HOE reference beam, said holographic optical element (HOE) reconstructs a phase-encoded HOE object beam for illumination of an amplitude-encoding off-axis-illuminated spatial light modulator (SLM).

9. The apparatus as recited in claim 8, further comprising at least one data storage device positioned with respect to said SLM, wherein said SLM, upon illumination by said phase-encoded HOE object beam, projects an amplitude-encoded and phase-encoded HMC object beam that, upon interfering with an HMC reference beam at a location within said data storage device, stores at least one hologram of said HMC object beam within said data storage device.

10. The apparatus as recited in claim 9, wherein said data storage device is a holographic memory cell (HMC).

11. The apparatus as recited in claim 8, wherein said holographic optical element (HOE) is made of at least one material selected from the group consisting of a photopolymer, a photoresist, a thermoplastic material, a photochemical material, a photorefractive material or a photochromatic material.

12. The apparatus as recited in claim 8, wherein said holographic optical element (HOE) has stored therein a plurality of holograms, wherein said plurality of holograms are multiplexed using at least one multiplexing technique selected from the group consisting of angle multiplexing, wavelength multiplexing, phase multiplexing, spatial multiplexing, shift multiplexing, correlation multiplexing and peristropic multiplexing.

13. The apparatus as recited in claim 8, wherein said holographic optical element (HOE) has a first surface and an opposing second surface, wherein said HOE reference beam illuminates said holographic optical element (HOE) from said first surface and wherein said holographic optical element (HOE) projects a transmission HOE object beam from said second surface thereof.

14. The apparatus as recited in claim 8, wherein said holographic optical element (HOE) has a first surface and an opposing second surface, wherein said HOE reference beam illuminates said holographic optical element (HOE) from said second surface and wherein said holographic optical element (HOE) projects a reflection HOE object beam from said second surface thereof.

15. A method for using a holographic optical element (HOE) in a holographic memory system, said method comprising the steps of:

providing at least one holographic optical element (HOE) having stored therein at least one hologram having at least phase-encoding functions of at least one phase mask and the focusing functions of at least one lens arrangement; and directing at least one HOE reference beam toward said holographic optical element to illuminate said holographic optical element in such a way that a phase-encoded HOE object beam is reconstructed and projected therefrom.

16. The method as recited in claim 15, further comprising the step of providing at least one spatial light modulator (SLM) capable of inducing amplitude modulation on said phase-encoded HOE object beam, said SLM positioned with respect to said holographic optical element in such a way that said phase-encoded HOE object beam reconstructed and projected from said holographic optical element illuminates said SLM in such a way as to project an amplitude-encoded and phase-encoded HOE object beam from said SLM.

17. The method as recited in claim 16, further comprising the step of positioning at least one data storage device in spaced relation to said SLM, wherein said SLM upon illumination by said phase-encoded HOE object beam projects an amplitude-encoded and phase-encoded HMC object beam that upon interfering with an HMC reference beam at a location within said data storage device stores at least one hologram of said HMC object beam within said data storage device.

18. The method as recited in claim 15, wherein said holographic optical element (HOE) has a first surface and an opposing second surface, wherein said directing step further comprises directing said HOE reference beam toward said first surface, and wherein said holographic optical element (HOE) projects a transmission HOE object beam from said first surface thereof.

19. The method as recited in claim 15, wherein said holographic optical element (HOE) has a first surface and an opposing second surface, wherein said directing step further comprises directing said HOE reference beam toward said second surface, and wherein said holographic optical element (HOE) projects a reflection HOE object beam from said first surface thereof.

20. The method as recited in claim 15, wherein said holographic optical element (HOE) is made of at least one material selected from the group consisting of a photopolymer, a photoresist, a thermoplastic material, a photochemical material, a photorefractive material or a photochromatic material.

21. A method for making at least one holographic optical element (HOE) that reconstructs a phase-encoded holographic optical element (HOE) object beam, said method comprising the steps of:

providing at least one holographic storage material capable of storing at least one phase-encoded holographic image therein, said holographic storage material having a first surface and an opposing second surface;

positioning a spatial light modulator (SLM) with respect to said holographic storage material in such a way that illumination of said SLM correspondingly illuminates said holographic storage material;

reverse illuminating said SLM with at least one phase-encoded HOE object beam in such a way that said SLM illuminates said holographic storage material with at least one phase-encoded and amplitude-encoded HOE object beam, wherein the at least one phase-encoded HOE object beam has at least the phase-encoding functions of at least one phase mask and the focusing functions of at least one lens arrangement; and directing at least one HOE reference beam toward said holographic storage material in such a way that said HOE reference beams interfere with said HOE object beams to form resulting interference patterns within said holographic storage material, wherein said interference patterns are stored by said holographic storage material as holograms to form said holographic optical element (HOE), wherein said holographic optical element (HOE), upon illumination by said HOE reference beam, reconstructs a phase-encoded HOE object beam for illumination of an amplitude-encoding off-axis-illuminated spatial light modulator (SLM) to produce a phase-encoded and amplitude-encoded object beam for storing holograms in a data storage device.

22. The method as recited in claim 21, wherein said reverse illuminating step further comprises illuminating said SLM by directing a reverse illumination beam through at least one phase mask and lens arrangement to said SLM.

23. The method as recited in claim 21, wherein said holographic optical element (HOE) is made of at least one material selected from the group consisting of a photopolymer, a photoresist, a thermoplastic material, a photochemical material, a photorefractive material or a photochromatic material.

24. The method as recited in claim 21, wherein SLM illuminates said holographic storage material by directing said HOE object beams toward said first surface of said holographic storage material and wherein said HOE reference beams are directed toward said first surface to form transmission holograms within said holographic storage material.

25. The method as recited in claim 21, wherein SLM illuminates said holographic storage material by directing said HOE object beams toward said first surface of said holographic storage material and wherein said HOE reference beams are directed toward said second surface to form reflection holograms within said holographic storage material.

\* \* \* \* \*